United States Patent [19]
Grider, III et al.

[11] Patent Number: 5,969,397
[45] Date of Patent: Oct. 19, 1999

[54] LOW DEFECT DENSITY COMPOSITE DIELECTRIC

[75] Inventors: Douglas Ticknor Grider, III, McKinney; Paul Edward Nicollian, Dallas, both of Tex.; Steve Hsia, San Jose, Calif.

[73] Assignee: Texas Instruments Incorporated, Dallas, Tex.

[21] Appl. No.: 08/974,325

[22] Filed: Nov. 19, 1997

Related U.S. Application Data

[60] Provisional application No. 60/032,041, Nov. 26, 1996.

[51] Int. Cl.$^6$ .............................. H01L 29/76; H01L 29/94
[52] U.S. Cl. ......................... 257/410; 257/310; 257/411; 257/639; 438/240; 438/250
[58] Field of Search .................................. 257/410, 411, 257/639, 310; 438/240, 250

[56] References Cited

U.S. PATENT DOCUMENTS

| | | | |
|---|---|---|---|
| 4,621,277 | 11/1986 | Ito et al. | 357/54 |
| 5,037,772 | 8/1991 | McDonald | 437/52 |
| 5,393,683 | 2/1995 | Matthews et al. | 437/42 |
| 5,859,760 | 1/1999 | Park et al. | 361/313 |

FOREIGN PATENT DOCUMENTS

| | | | |
|---|---|---|---|
| 0 187 278 | 7/1986 | European Pat. Off. | H01L 29/60 |
| 0 617 461 | 9/1994 | European Pat. Off. | H01L 21/318 |
| WO 84/00852 | 3/1984 | WIPO | H01L 29/60 |
| WO 86/03621 | 6/1986 | WIPO | H01L 21/314 |

OTHER PUBLICATIONS

1991 IEEE, IEDM 91–359, "Very Lightly Nitrided Oxide Gate Mosfets for Deep Sub–mircron CMOS Devices," pp. 13.2.1–13.2.4 (Hisayo Sasaki Momose, Toyota Morimoto. Yoshio Ozawa, Masakatsu Tsuchiaki, Mizuki Ono, Kikuo Yamabe and Hiroshi Iwai).

IEEE, IEDM–93–459, "A Boron–Retarding and High Interface Quality Thin Gate Dielectric for Deep Sub–Micron Devices," pp. 18.1.11–18.1.4 (L. Manchanda, G.R. Weber, W. Mansfield, D.M. Boulin, K. Krisch, Y.O. Kim, R. Storz, N. Moriya, H.S. Luftman, L.C. Feldman, M.L. Green, R.C. Kistler, J.T.C. Lee and F. Klemens).

1996 IEEE, IEDM 96–495, "Ultrathin Nitrogen Profile Engineered Gate Dielectric Films," pp. 19.1–1.19.1.4 (S.V. Hattangady, R. Kraft, D.T. Grider, M.A. Douglas, G.A. Brown, P.A. Tiner, J.W. Kuehne, P.E. Nicollian and M.F. Pas).

AT&T Technical Journal, Nov./Dec. 1988, "Synthesis of High–Quality Ulta–Thin Gate Oxides for ULSI Applications", pp. 155–174 (Pradip K. Roy and Ashok K. Sinha).

1993 IEEE, "A Boron–Retarding and High Interface Quality Thin Gate Dielectric for Deep–Submicron Devices", pp. 93–459 thru 93–462, (L. Manchanda, G.R. Weber, W. Mansfield, D. M. Boulin, K. Krisch, Y.O. Kim, R. Storz, N. Moriya, H.S. Luftman, L.C. Feldman, M.L. Green, R.C. Kistler, J.T.C. Lee, F. Klemens).

*Primary Examiner*—Valencia Martin-Wallace
*Attorney, Agent, or Firm*—Jacqueline J. Garner; Wade James Brady; Richard L. Donaldson

[57] ABSTRACT

A composite dielectric layer (102). A first layer (112) of the composite dielectric layer (102) has a small to no nitrogen concentration. A second layer (114) of the composite dielectric layer (102) has a larger nitrogen concentration (e.g., 5–15%). The composite dielectric layer (102) may be used as a thin gate dielectric wherein the second layer (114) is located adjacent a doped gate electrode (110) and has sufficient nitrogen concentration to stop penetration of dopant from the gate electrode (110) to the channel region (108). The first layer (112) is located between the second layer (114) and the channel region (108). The low nitrogen concentration of the first layer (112) is limited so as to not interfere with carrier mobility in the channel region (108).

16 Claims, 1 Drawing Sheet

LOW DEFECT DENSITY COMPOSITE DIELECTRIC

This appln. claims the benefit of provisional appln. Ser. No. 60/032,041 filed Nov. 26, 1996.

FIELD OF THE INVENTION

This invention generally relates to semiconductor device and more specifically to low defect density dielectrics.

BACKGROUND OF THE INVENTION

As semiconductor device geometries continue to shrink, dielectric layers such as those used to form gate dielectrics in MOSFET transistors need to become thinner to maintain transistor operating characteristics. FIG. 1 shows a p-type MOSFET transistor 10 having a thin gate dielectric 18. Gate dielectric 18 may, for example, comprise a thin layer of thermally grown silicon dioxide. Alternatively, for lower defect density, a composite of a thermally grown silicon dioxide with an overlying LPCVD silicon dioxide may be used. Gate dielectric 18 separates gate electrode 20 from the channel region 16. Gate electrode 20 typically comprises polysilicon doped for lower resistance. For a p-type MOSFET, boron is typically used to dope the gate electrode 20 and source/drain regions 14. However, due to the thinness of gate dielectric 18, during processing, boron from gate electrode 20 penetrates through the gate dielectric 18 into the channel region 16. Boron penetration into the channel impairs the performance of the transistor by degrading threshold voltage control, increasing off-state current leakage and decreasing reliability.

Several structures have been developed to stop boron penetration into the channel region. In one structure, the gate dielectric 18 is formed by thermally growing a silicon dioxide in a $N_2O$ ambient to create an oxynitride. In another structure, the gate dielectric 18 formed by depositing a nitrogen-doped oxide. Both structures use nitrogen at the gate dielectric/silicon interface to stop the boron penetration. Unfortunately, the nitrogen levels required in the gate dielectric 18 to stop boron penetration degrade transistor carrier mobility. The nitrogen acts as a coulombic charge scattering center on the channel carriers, reducing their mobility. Thus, in determining the concentration of nitrogen to include in gate dielectric 18, there is a trade-off between blocking the boron penetration and maintaining high channel conductance.

SUMMARY OF THE INVENTION

The invention disclosed herein is a composite dielectric layer having low defect density. A first layer of the composite dielectric layer, for example, a LPCVD oxynitride or a nitrogen-doped oxide, contains a significant nitrogen concentration. The nitrogen concentration is sufficient to block dopants from penetrating through the dielectric layer. A second layer of the composite dielectric layer contains a significantly smaller nitrogen concentration (e.g., <1%) or no nitrogen concentration at all. The second layer may be used to separate the first layer from another layer in the device that may be negatively affected by the higher nitrogen content (e.g., a channel region of a transistor for which nitrogen negatively impacts carrier mobility).

An advantage of the invention is providing a dielectric layer that can prevent boron penetration without impacting carrier mobility.

Another advantage of the invention is providing a dielectric layer having a low defect density and low leakage characteristics.

These and other advantages will be apparent to those of ordinary skill in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention is a composite dielectric layer and will now be described in conjunction with a p-type MOSFET having a thin gate dielectric (i.e., <60 Å). However, it will be apparent to those skilled in the art that the dielectric layer is also applicable to other dielectric layers such as those used in inter-poly situations (e.g., DRAM stacked capacitors), thin film transistors, and other MOSFETS including those having thicker gate dielectrics (i.e., >60 Å).

Figure 1:
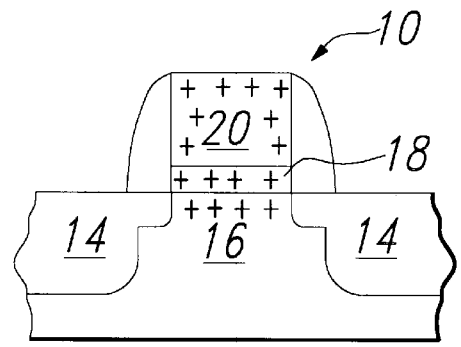
FIG. 1 is a cross-sectional diagram of a prior art p-type MOSFET illustrating boron penetration into the channel region.
Figure 2:
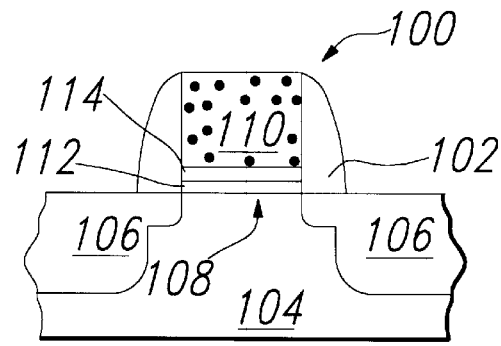
FIG. 2 is a cross-sectional diagram of a p-type MOSFET including a gate dielectric according to the invention.

A p-type MOSFET 100 having a thin composite gate dielectric 102 according to an embodiment of the invention is shown in FIG. 2. P-type source/drain regions 106 are located in semiconductor body 104. Gate electrode 110 is separated from channel region 108 by gate dielectric 102. Various conductive material choices for gate electrode 110 are known in the art. For example, gate electrode 110 may comprise a doped conductive material such as doped polysilicon. In order to more fully demonstrate the advantages of the invention, the following discussion assumes that gate electrode 110 comprises polysilicon doped with boron. However, it should be noted that the invention is applicable to other dopants as well.

Gate dielectric 102 comprises at least two distinct layers 112 and 114. Dielectric layer 112 is located adjacent to channel region 108 and has little to no nitrogen content. On the other hand, dielectric layer 114 has a relatively high nitrogen content and is spaced away from channel region 108 by layer 112. Nitrogen retards the diffusion of boron dopants through a given layer. However, nitrogen also degrades carrier mobility when nitrogen is located at the dielectric layer/channel region interface. This is due to the fact that nitrogen at this interface acts as a coulombic charge scattering center on the carriers in the channel region, reducing carrier mobility. Thus, the nitrogen content in layer 114 is chosen to be sufficient to block the penetration of boron from gate electrode 110 to channel region 108 and the nitrogen content in layer 112 is chosen to minimize the influence of nitrogen on carrier mobility in the channel region. In the preferred embodiment, layer 112 has a nitrogen content less than 1% (e.g., 0–1%) and layer 114 preferably has a nitrogen content in the range of 5–15%. However, it should be noted that a high percentage of nitrogen may alternatively be used. Thus, the trade-off required in prior art methods between boron blocking and carrier mobility is eliminated by having two distinct layers, one optimized for each factor.

Figure 3A:
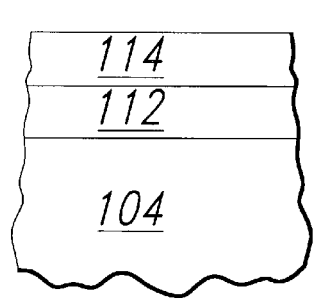
FIG. 3A is a cross-sectional diagram of the p-type MOSFET of FIG. 2 during fabrication.

A method for forming gate dielectric 102 will now be discussed. First, layer 112 is formed on the surface of semiconductor body as shown in FIG. 3A. Layer 112 contains little to no nitrogen (i.e., <1%). For example, layer 112 may be a thermally grown silicon dioxide. Other examples for layer 112 will be apparent to those of ordinary skill in the art. For example, layer 112 may be grown in a variety of oxidizing ambients (e.g., O2, N2O, NO) and by a variety of reactors (furnace or single wafer reactor). The thickness of layer 112 depends on the total thickness of dielectric layer 102. Typical thicknesses for a thin gate dielectric may be in the range of 15–25 Å. Next, layer 114, having a relatively high concentration of nitrogen is formed on layer 112. Layer 114 may, for example, be an oxynitride deposited by low pressure chemical vapor deposition (LPCVD) or a nitrogen doped high temperature oxide by conventional furnace or single wafer reactor. Again, the thickness of layer 114 depends on the total thickness desired for dielectric layer 102 with a typical thickness for a thin dielectric layer being in the range of 10–20 Å. The overall thickness of gate dielectric 102 is determined by conventional means based on the required device parameters.

After the formation of layer 114, a light reoxidation may be performed to reduce stress between layers 112 and 114. If desired, the light reoxidation may be performed in a $N_2O$ ambient (or $N_2O$ and $O_2$ or NO) to improve reliability. However, the nitrogen content of layer 114 should be limited such that it is transparent to the oxidizing species during reoxidation so as not to introduce sufficient nitrogen quantities into layer 112 to harm mobilities and carrier transport properties. The final nitrogen concentration in layer 112 should remain less than 1%.

Figure 3B:
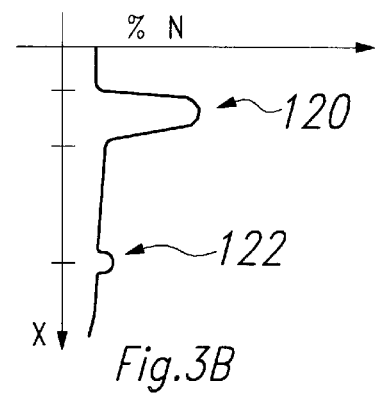
FIG. 3B is a graph of nitrogen concentration versus depth within the dielectric layer of FIG. 3A.

An example of a final nitrogen profile is illustrated in FIG. 3B. A nitrogen peak 120 of the oxide or oxynitride layer 114 provides boron blocking and has little influence on channel conduction properties. The peak nitrogen concentration may be in the range of 5–15%. A small percentage of nitrogen may also be found in layer 112 due to the light reoxidation step. The peak nitrogen level 122 in layer 112 is sufficient to improve reliability while having little effect on conduction by virtue of its small level (0.25–0.75%).

After the light reoxidation, conventional processing continues with the deposition of the gate electrode material, patterning and etch of the gate electrode material and gate dielectric 102, and formation of the source/drain regions 106. Following that, the source/drain regions and gate electrode may be silicided and interconnections between MOSFET 100 and other devices (not shown) maybe formed.

Figure 4:
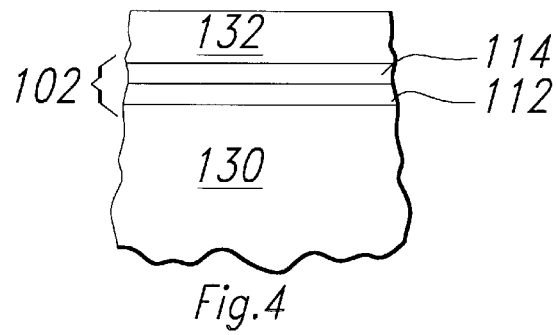
FIG. 4 is a cross-section diagram of capacitor including a dielectric layer according to the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the gate dielectric structure is scalable to thicker films (i.e., >60 Å) and thin film transistors. Furthermore, the dielectric layer may be applied to DRAM capacitor applications, as shown in FIG. 4 wherein the dielectric layer 102 is placed between capacitor plates 130 and 132. Advantages for the DRAM capacitor application include low leakage and low defect density. It is therefore intended that the appended claims encompass any such modifications or embodiments.

What is claimed is:

1. A composite dielectric layer comprising:

a first dielectric layer having a nitrogen content less than 1%; and a second dielectric layer having a nitrogen content sufficient to block penetration of dopants; wherein said second dielectric layer has a thickness on the order of 10–20 Å.

2. The composite dielectric layer of claim 1, wherein said first dielectric layer is located adjacent a channel region of a transistor and said second dielectric layer is spaced from said channel region.

3. The composite dielectric layer of claim 1, wherein said first dielectric layer comprises silicon dioxide.

4. The composite dielectric layer of claim 1, wherein said second dielectric layer comprises a nitrogen-doped oxide.

5. The composite dielectric layer of claim 1, wherein said second dielectric layer comprises an oxynitride.

6. The composite dielectric layer of claim 1, wherein said first dielectric layer has a thickness on the order of 15–25 Å.

7. The composite dielectric layer of claim 1, wherein said second dielectric layer has a nitrogen concentration in the range of 5–15%.

8. The composite dielectric layer of claim 1, wherein said first dielectric layer is located between a first polysilicon layer and said second dielectric layer and said second dielectric layer is located between said first dielectric layer and a second polysilicon layer.

9. The composite dielectric layer of claim 1, wherein said first dielectric layer and second dielectric layer are located between first and second plates of a capacitor.

10. A MOSFET transistor, comprising:

a source region located in a semiconductor body;

a drain region located in said semiconductor body;

a channel region located between said source region and said drain region in said semiconductor body;

a doped gate electrode disposed over said channel region; and a gate dielectric disposed between said doped gate electrode and said channel region, said gate dielectric comprising:

a first layer located adjacent said channel region and having a sufficiently small nitrogen concentration such that carrier mobility in said channel region is not influenced; and a second layer located adjacent said gate electrode and having a nitrogen concentration sufficient to block the penetration of dopants from said doped gate electrode, wherein said second layer has a thickness on the order of 10–20 Å.

11. The transistor of claim 10, wherein said first layer contains a nitrogen concentration between 0 and 1%.

12. The transistor of claim 10, wherein said second layer has a nitrogen concentration between 5 and 15%.

13. The transistor of claim 10, wherein said doped gate electrode is doped with boron.

14. The transistor of claim 10, wherein said first layer comprises silicon dioxide.

15. The transistor of claim 10, wherein said second layer comprises a nitrogen-doped oxide.

16. The transistor of claim 10, wherein said second layer comprises an oxynitride.

* * * * *